(12) United States Patent
    Lee

(10) Patent No.: US 12,038,719 B2
(45) Date of Patent: Jul. 16, 2024

(54) METHOD FOR PREPARING HOLOGRAPHIC PATTERN-EXPRESSING ORGANOGEL USING DITHERING MASK

(71) Applicant: UNIST (ULSAN NATIONAL INSTITUTE OF SCIENCE AND TECHNOLOGY), Ulsan (KR)

(72) Inventor: Jiseok Lee, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 681 days.

(21) Appl. No.: 17/291,499

(22) PCT Filed: Jul. 28, 2020

(86) PCT No.: PCT/KR2020/009916
    § 371 (c)(1),
    (2) Date: May 5, 2021

(87) PCT Pub. No.: WO2021/033937
    PCT Pub. Date: Feb. 25, 2021

(65) Prior Publication Data
    US 2022/0004147 A1    Jan. 6, 2022

(30) Foreign Application Priority Data
    Aug. 20, 2019   (KR) .......................... 10-2019-0101827

(51) Int. Cl.
    G03H 1/18          (2006.01)
    C08J 3/075         (2006.01)
    (Continued)

(52) U.S. Cl.
    CPC ................ G03H 1/18 (2013.01); C08J 3/075 (2013.01); C08J 3/28 (2013.01); G03F 7/001 (2013.01);
    (Continued)

(58) Field of Classification Search
    None
    See application file for complete search history.

(56) References Cited

U.S. PATENT DOCUMENTS 6,180,288 B1 * 1/2001 Everhart .................. G03F 7/00
                                                              430/1

FOREIGN PATENT DOCUMENTS

JP   2002-311565 A   10/2002
JP   2007-248716 A    9/2007
(Continued)

OTHER PUBLICATIONS

Yue et al., Supramolecular Liquid-Crystalline Polymer Organogel: Fabrication, Multiresponsiveness, and Holographic Switching Properties, 2019, 31, 3388-3394 (Year: 2019).*

(Continued)

*Primary Examiner* — Robert E. Tallman
(74) *Attorney, Agent, or Firm* — Kilpatrick Townsend & Stockton LLP

(57) ABSTRACT

A method of manufacturing a holographic pattern-expressing organogel, by using a dithering mask, according to an aspect of the present disclosure includes: preparing a dithering mask including white pixels and black pixels arranged in periodic patterns; photocuring a polymer by passing an ultraviolet ray through the dithering mask; passing a first solvent through the cured polymer; and passing a second solvent through the cured polymer through which the first solvent is passed.

11 Claims, 13 Drawing Sheets

(51) Int. Cl.
*C08J 3/28* (2006.01)
*G03F 7/00* (2006.01)
*G03H 1/02* (2006.01)

(52) U.S. Cl.
CPC ........ *G03F 7/7005* (2013.01); *G03F 7/70283* (2013.01); *C08J 2335/02* (2013.01); *G03H 2001/0264* (2013.01); *G03H 2001/185* (2013.01); *G03H 2224/00* (2013.01); *G03H 2260/12* (2013.01); *G03H 2260/14* (2013.01)

(56) References Cited

FOREIGN PATENT DOCUMENTS

| JP | 2010-107952 A | 5/2010 |
| JP | 2010-237652 A | 10/2010 |
| KR | 2007-0108947 A | 11/2007 |

OTHER PUBLICATIONS

International Search Report and Written Opinion dated Nov. 24, 2020 in International Patent Application No. PCT/KR2020/009916 filed Jul. 28, 2020, 8 pages.

\* cited by examiner

METHOD FOR PREPARING HOLOGRAPHIC PATTERN-EXPRESSING ORGANOGEL USING DITHERING MASK

TECHNICAL FIELD

The present disclosure relates to a method of manufacturing an organogel generating a holographic pattern and an organogel manufactured using the method.

The present disclosure is funded by the Ministry of Trade, Industry and Energy, with the project number 1415162282 titled "Development of an electrochemical gas sensor having a slim structure with a height of 3 mm or less for application to a wearable device and gas classification technology in a complex gas environment", funded by the Ministry of Education, with the project number 1345281919 titled "Development of up-conversion micro-crystal complex optical waveguide by using a photocurable 3D printing technique and a method of adjusting the distance between atoms," funded by the Ministry of Science, Technology and Information and Communication, with the project number 1711083214 titled "Development of an algorithm for establishing a 3D printer monitoring system and controlling data-based processing deformation-minimization for the manufacturing innovation in the automobile industry", and funded by the Ministry of Environment, with the project number 1711076220 titled "Synthesis of semi-solid electrolyte for electrochemical gas sensors, a printing process, and establishment of a sensor performance evaluation system therefor."

BACKGROUND ART

Holography is not a newly emerged technology, and its principle was already found in the 1940s. Since, in accordance with the development of a laser light source, development of analog holography for realizing high-quality images has been in progress. Since the 1990s, holography is making new developments along with the development of digital technology, and the recent remarkable development in display devices and computing is raising expectations of an advancement from the current glasses-type stereo 3D TVs to holographic 3D TVs. Also, the applicability of holography to the security industry in various ways is increasingly gaining attention.

Holography which is based on wave optics allows capturing and reproduction of not only an intensity of light but also of a phase of light, and recently, the advancement in imaging devices and light modulation devices have enabled digital capturing, processing, and reproduction of holography, and various holography techniques are being developed by applying these techniques.

Most holograms commercially used in the related art are recordings of an original image on a medium as interference fringes by using an optical method. Recently, however, a method of making a hologram by forming interference fringes on a recording surface by calculation using a calculator is known.

Also, the kind of "holograms" originally means an optical interference fringe pattern from which a stereoscopic image can be reproduced, but recently, a medium called "pseudo holograms" which form a diffractive grating pattern instead of an optical interference fringe pattern is also supplied.

Also, as mentioned above, the kind of "holograms" refers to a recording of optical interference fringes between object light and reference light, on a medium, but recently, media expressing various motifs by using a diffractive grating pattern or a scattering structure pattern is also generally called "holograms."

A medium for making holograms as above by receiving and scattering light is developed using various materials and methods. Nevertheless, there has been a request from the market to solve the complexity of the working method of holograms and the simplicity of holograms realized. Also, a demand for a medium for reversibly realizing a hologram and then making it disappear has been made.

DESCRIPTION OF EMBODIMENTS

Technical Problem

One or more embodiments provide the manufacture of an organogel expressing a novel and dynamic holographic pattern that is reversible and has reactivity to various modes to address the above-described problem and meet the demand of the market.

One or more embodiments provide an organogel structure of which optical characteristics reversibly change, provided by using a simple method of using a dithering mask, wherein the organogel structure may express a holographic pattern or make the holographic pattern disappear according to an external environment.

However, the problem to be solved by the present disclosure is not limited to those mentioned above, and other problems not mentioned herein will be clearly understood by those skilled in the art from the following description.

Solution to Problem

According to an aspect of the present disclosure, there is provided a method of manufacturing a holographic pattern-expressing organogel, by using a dithering mask, the method including: preparing a dithering mask including white pixels and black pixels arranged according to periodic patterns; photocuring a polymer by passing an ultraviolet ray through the dithering mask; passing a first solvent through the cured polymer; and passing a second solvent through the cured polymer through which the first solvent is passed.

According to an embodiment, in the photocuring of a polymer by passing an ultraviolet ray through the dithering mask, a digital micromirror device (DMD)-based exposure device may be used.

According to an embodiment, the polymer may include one or more selected from polydiacetylene (PDA), polyethylene glycol diacrylate (PEG-DA), 1,6-hexanediol diacrylate (HDDA), and polyurethane acrylate (PUA).

According to an embodiment, the first solvent may have a lower hydrogen bonding ability than the second solvent, and in the passing of the first solvent, the cured polymer may expand, and in the passing of the second solvent, the cured polymer may contract.

According to an embodiment, the first solvent may include one or more selected from acetonitrile (ACN), dimethylformamide, dimethylsulfoxide, and acetone, and the second solvent may include one or more selected from PEG, methanol, ethanol, isopropanol, n-butanol, and water.

According to an embodiment, the organogel may include a rod region and a matrix region each formed in periodic patterns, the rod region having a high curing density and the matrix region having a low curing density, and as a three-dimensional refractive index distribution of the rod region and the matrix region is varied through asymmetric contraction occurring during a solvent exchange, the organogel may express a holographic pattern upon light irradiation and when exposed to the second solvent.

According to an embodiment, after the passing of the second solvent through the cured polymer through which the first solvent is passed, the passing of the first solvent may be performed one or more times again; or performing the passing of the first solvent and then the passing of the second solvent may be performed one or more times again.

According to an embodiment, when the passing of the first solvent is performed, holographic pattern expression of the organogel may be turned off, and when the passing of the second solvent is performed, holographic pattern expression of the organogel may be turned on.

According to an embodiment, a pattern of the dithering mask may include an external geometric pattern and an internal dithering pattern formed in the external geometric pattern.

A holographic pattern-expressing organogel structure using a dithering mask, according to another aspect of the present disclosure may be manufactured using the method of manufacturing an organogel according to an embodiment of the present disclosure, and the organogel may include a rod region and a matrix region each formed in periodic patterns, the rod region having a high curing density and the matrix region having a low curing density, and the rod region and the matrix region may express a holographic pattern as a refractive index distribution of the rod region and the matrix region is varied through asymmetric contraction occurring along a z-axis during a solvent exchange and scattering characteristics are varied in a boundary between the rod region and the matrix region when light is irradiated. The holographic pattern has full parallax, which is the characteristic of a hologram, and a three-dimensional holographic pattern of various shapes is expressed when the organogel is inclined in upward, downward, left, right, and diagonal directions from a center thereof.

Advantageous Effects of Disclosure

A method of manufacturing an organogel capable of expressing a holographic pattern, according to the present disclosure, does not require a complicated manufacturing method, and provides a new holographic pattern-realizing medium that has overcome the drawbacks of an existing holographic pattern-realizing medium providing only an irreversible holographic pattern.

According to a method of manufacturing an organogel structure of the present disclosure, a holographic to be realized can be designed delicately by using a dithering mask.

Also, an organogel structure, realizing a holographic pattern, according to an embodiment of the present disclosure, has such optical characteristics that are changed according to changes in an external environment such as an exchange of a solvent, and provides the effects of reversibly performing expression and blocking of a holographic pattern.

An organogel to be provided according to the present disclosure, reversibly reacts to an external environment to control a path of light to thereby vary optical characteristics of the organogel, and accordingly, characteristics of holographic patterns are varied microscopically (bright field, fluorescence).

The above-described effects indicate that the manufacturing method according to the present disclosure and the organogel structure manufactured thereby may be versatile in various industry areas, and particularly useful in a large number of fields including the security industry.

MODE OF DISCLOSURE

Figure 1:
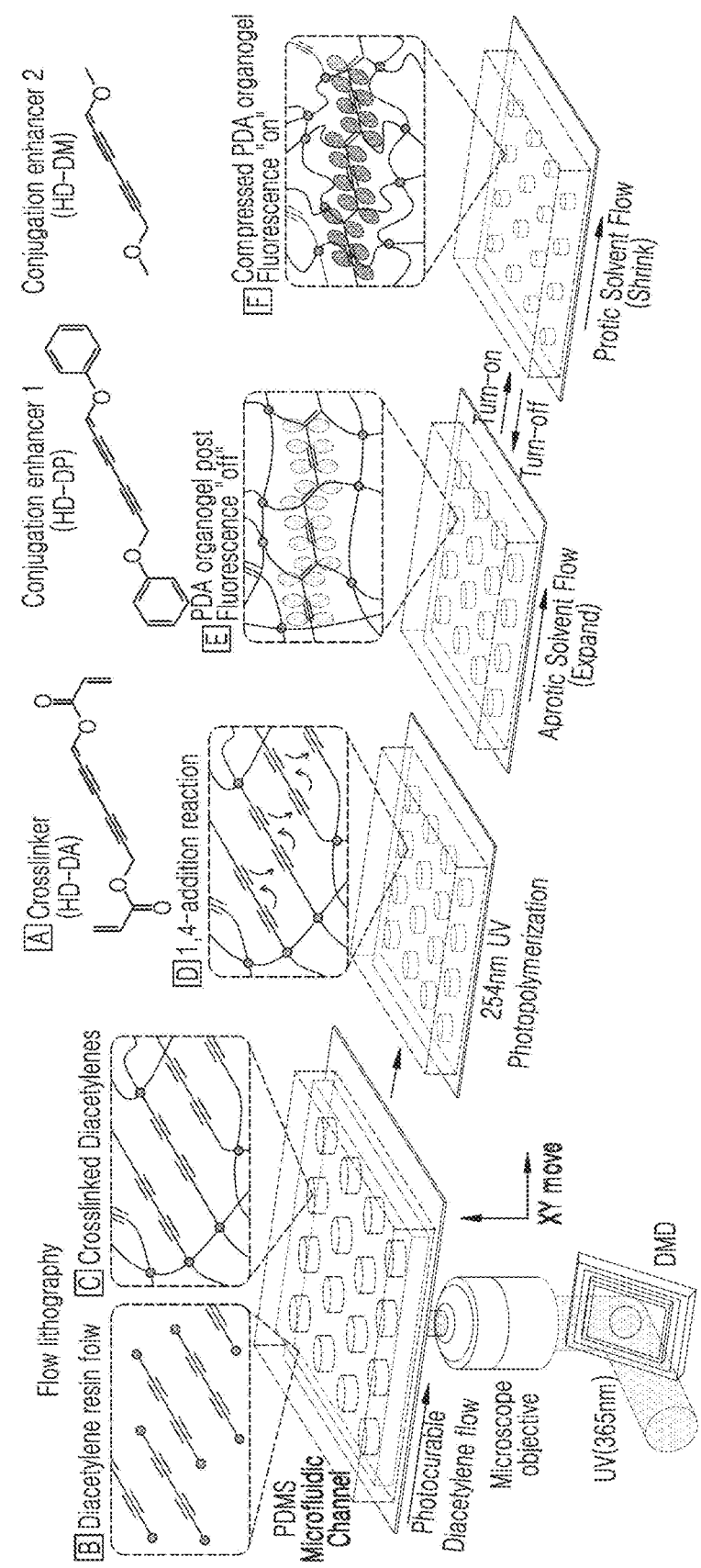
FIG. 1 is a process diagram schematically illustrating operations of a method of manufacturing a holographic pattern-expressing organogel, by using a dithering mask, according to an embodiment of the present disclosure.

Embodiments of the present disclosure will now be described with reference to the accompanying drawings. In the description of the disclosure, certain detailed explanations of related art are omitted when it is deemed that they may unnecessarily obscure the essence of the present disclosure. The terms used in this specification are those terms in consideration of functions in regard to the present disclosure, but the terms may vary according to the intention of those of ordinary skill in the art, precedents, or customs. Thus, the terms used in the specification should be understood based on the overall description of the present disclosure. The same reference numerals in each drawing indicate the same members.

Throughout the specification, when a member is said to be positioned "on" another member, this includes not only the case where the member is in contact with the other member, but also the case where another member exists between the two members.

Throughout the specification, it will also be understood that when a component "includes" an element, it should be understood that the component does not exclude another element but may further include another element.

Hereinafter, a tantalum carbide coating material according to the present disclosure will be described in detail by referring to the embodiments and the drawings. However, the present disclosure is not limited to the embodiments and the drawings.

In the present disclosure, a holographic pattern to be described later refers to a broad concept encompassing not only an existing holographic pattern including an optical interference fringe pattern but also a pseudo holographic pattern formed of a diffractive grating pattern, a pseudo holographic pattern formed of a scattering structure pattern, or the like.

The inventors of the present disclosure have been inspired by the changes in patterns and colors according to an external environment in the natural world and have developed a method of manufacturing an organogel expressing a novel and dynamic holographic pattern that is reversible and has reactivity to various modes. The present disclosure is a product of research into development of a holographic pattern of a new concept, which has overcome the drawbacks of the existing one which requires a complicated manufacturing process and is irreversible.

In the present disclosure, a dithering mask may be introduced to manufacture an organogel capable of expressing a holographic pattern. A dithering mask may be designed to include white pixels and black pixels. The dithering mask may include regions differing in patterns, that is, in arrangements or densities or the like, of white pixels and black pixels. For example, in a first region, a density of white pixels may be relatively high and a density of black pixels may be relatively low, and vice versa in a second region. For example, more white pixels may be formed in the first area than in the second area having an equal area to that of the first area. The dithering mask introduced according to the present disclosure is a photomask of a new concept, whereby an amount of light irradiated to a polymer to be cured may be finely controlled in each region.

As such, the dithering mask as described above is introduced, and by using an ultraviolet ray that has passed through the dithering mask, a polymer medium may be cured.

According to an embodiment, in the process of photocuring a polymer by passing an ultraviolet ray through the dithering mask, a digital micromirror device (DMD)-based exposure device may be used. Here, when exposure to an ultraviolet ray through a dithering mask, an amount or wavelength of light irradiated to each polymer region may be controlled. Accordingly, a curing density of each polymer region may be controlled.

The cured polymer structure may include a rod portion having a relatively high curing density and a matrix portion having a relatively low curing density. Here, according to a pre-design of the dithering mask, a pattern arrangement of the rod portion and the matrix portion may be implemented periodically. When an organogel structure in which the pattern arrangement is formed is exposed to light, a holographic pattern may be generated. Also, in an embodiment of the present disclosure, by exposing to a second solvent according to the periodic pattern arrangement, the shape of a holographic pattern during contraction may be variously implemented. A holographic pattern generated during contraction may be generated during exposure to the second solvent. The shape of holographic pattern during contraction may vary according to the periodic pattern arrangement.

FIG. 1 is a process diagram schematically illustrating operations of a method of manufacturing a holographic pattern-expressing organogel, by using a dithering mask, according to an embodiment of the present disclosure.

Hereinafter, operations of the method of manufacturing an organogel according to the present disclosure will be described in detail with reference to FIG. 1.

A method of manufacturing an organogel expressing a holographic pattern, by using a dithering mask provided according to an aspect of the present disclosure, includes: preparing a dithering mask including white pixels and black pixels arranged in periodic patterns; photocuring a polymer by passing an ultraviolet ray through the dithering mask; passing a first solvent through the cured polymer; and passing a second solvent through the cured polymer through which the first solvent is passed.

The dithering mask may include various patterns. The dithering mask may be divided into a first region and a second region, and the first region and the second region may have different pixel formation patterns. The dithering mask may further include a third region having a same pattern as that of one of the first region and the second region and a fourth region having a pattern that is not identical to that of any one of the first region and the second region.

An ultraviolet ray that has passed through the dithering mask may cure the polymer. A process in which the polymer is cured may be performed in a similar manner as applied to a typical polymer curing process. However, due to a difference in light passing through the white pixel portion and the black pixel portion of the dithering mask, cross-link may occur in a certain region of the polymer, and a rod having a relatively high density may be formed. On the other hand, in another region of the polymer, cross-link is not caused, and thus, a matrix portion having a relatively low density may be formed. According to a patterning method using the dithering mask, the rod region may also have varying densities.

When the photocuring process is ended, the first solvent may be injected into the cured polymer. The first solvent may here form a flow in a direction. When the first solvent is injected, the holographic pattern-expressing characteristics may be turned off in the photocured polymer.

After injecting the first solvent, the second solvent may be injected into the cured polymer to try a solvent exchange. Here, the second solvent may form a flow in a direction. When the second solvent is injected, the holographic pattern-expressing characteristics may be turned on in the photocured polymer.

The first solvent and the second solvent may be sequentially injected. The holographic pattern-expressing characteristics that are turned off or turned on according to the injection of the first solvent and the second solvent, may be reversible. That is, according to an embodiment of the present disclosure, the holographic pattern characteristics may be expressed or blocked according to a solvent exchange, and changes as these may be reversibly performed as much as possible.

According to an embodiment, the polymer may include one or more selected from polydiacetylene (PDA), polyethylene glycol diacrylate (PEG-DA), 1,6-hexanediol diacrylate (HDDA), and polyurethane acrylate (PUA).

While any material that is photocured to be cross-linked may be sufficient as the polymer, more preferably, the polymer may be selected from a polymer group including a photocurable functional group as a common feature applicable to the present disclosure.

According to an embodiment, the polymer may further include a conjugation additive.

The conjugation additive may be added to a polymer such as PDA to perform a function of reinforcing the holographic pattern characteristics.

For example, HD-DA, HD-DP, HD-DM, or two out of these three light-emission additives may be further included. By further including a light-emission additive as above, a clear holographic pattern may be realized. DA-HD is a molecule including diacrylate which is a photocurable functional group, and also includes a diacetylene functional group to generate polydiacetylene (PDA) through 254 nm-UV polymerization. Also, although HD-DP and HD-DM do not include a photocurable functional group, they include a diacetylene group, and may thus increase a conjugation efficiency to increase a light emission intensity.

According to an embodiment, the first solvent may have a lower hydrogen bonding ability than the second solvent, and in the passing of the first solvent, the cured polymer may expand, and in the passing of the second solvent, the cured polymer may contract.

The first solvent and the second solvent may be each selected from solvent groups, the hydrogen bonding abilities of which differ from each other by a certain degree or greater.

Table 1 below shows Kamlet-Taft Solvatochromism parameters. Hydrogen donors, hydrogen acceptors, and dipolarity/polarizability of water, methanol, n-butanol, PEG 200, acetonitrile, and dimethyl sulfoxide (DMSO) are shown.

TABLE 1

| Solvent | Hydrogen donor ($\alpha$) | Hydrogen acceptor ($\beta$) | Dipolarity/polarizability ($\pi^*$) |
|---|---|---|---|
| Water | 1.17 | 0.18 | 1.09 |
| Methanol | 0.93 | 0.62 | 0.6 |
| n-butanol | 0.79 | 0.88 | 0.47 |
| PEG 200 | 0.46 | 0.65 | 0.915 |
| Acetonitrile | 0.19 | 0.31 | 0.75 |
| DMSO | 0 | 0.76 | 1 |

When a hydrogen bonding ability and a hydrogen bond donor value are less than 0.2, the first solvent may be used.

When the first solvent is allowed to pass therethrough, a $\pi$-bond between cured polymers may form a well-aligned p-orbital structure. When the second solvent is allowed pass therethrough, a $\pi$-bond between cured polymers may form a twisted p-orbital structure.

According to an embodiment, the first solvent may include one or more selected from acetonitrile (ACN), dimethylformamide, dimethylsulfoxide, and acetone, and the second solvent may include one or more selected from PEG, methanol, ethanol, isopropanol, n-butanol, and water.

According to an embodiment, the organogel may include a rod region and a matrix region each formed in periodic patterns, wherein the rod region has a high curing density and the matrix region has a low curing density, and as a three-dimensional distribution of the rod region and the matrix region is varied, the organogel may express a holographic pattern upon light irradiation.

According to an embodiment, wherein after the passing of the second solvent through the cured polymer through which the first solvent is passed, the passing of the first solvent may be performed one or more times again; or performing the passing of the first solvent and then the passing of the second solvent may be performed one or more times again.

The above process allows a reversible change in holographic pattern characteristics of the organogel structure according to the present disclosure.

According to an embodiment, when the passing of the first solvent is performed, holographic pattern expression of the organogel may be turned off, and when the passing of the second solvent is performed, holographic pattern expression of the organogel may be turned on.

According to an embodiment, a pattern of the dithering mask may include an external geometric pattern and an internal dithering pattern formed in the external geometric pattern.

A holographic pattern-expressing organogel structure using a dithering mask, according to another aspect of the present disclosure may be manufactured using the method of manufacturing an organogel according to an embodiment of the present disclosure, and the organogel may include a rod region and a matrix region each formed in periodic patterns, the rod region having a high curing density and the matrix region having a low curing density, and the rod region and the matrix area may express a holographic pattern as a three-dimensional distribution of the rod region and the matrix region is varied through asymmetric contraction occurring during a solvent exchange to vary a refractive index distribution thereof and thus scattering characteristics are varied in a boundary between the rod region and the matrix area when light is irradiated.

According to an embodiment, optical characteristics of the organogel may reversibly change as the organogel reacts to a change in an external environment.

Through a solvent exchange method between the first solvent and the second solvent, the holographic pattern-expressing characteristics of the organogel according to the present disclosure may be turned off or turned on, and changes as above may be reversible.

According to an embodiment, the organogel involves a full parallax phenomenon, and by inclining the organogel, a holographic pattern may be changed.

By inclining the organogel upward, downward, to the left, to the right, and diagonally with respect to a center thereof, three-dimensional holographic patterns of various shapes may be expressed.

EXAMPLES

Hereinafter, characteristics of a holographic pattern-expressing organogel manufactured as an embodiment of the present disclosure will be described in further detail by referring to the drawings.

Figure 2:
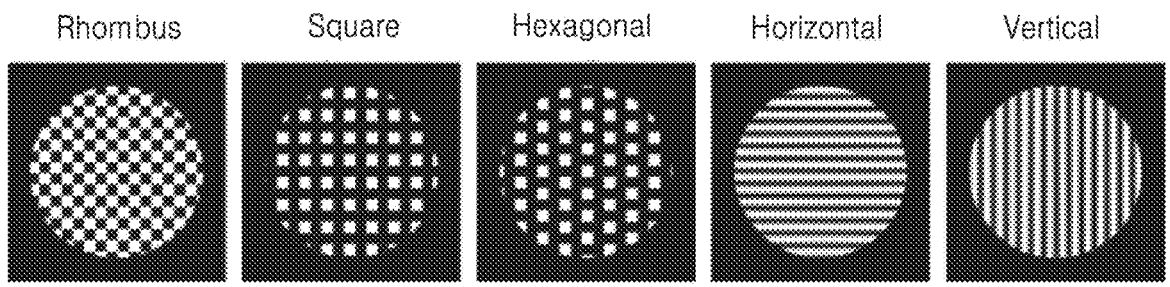
FIG. 2 is a schematic diagram illustrating patterns of a dithering mask used as an embodiment of the present disclosure.

FIG. 2 is a schematic diagram illustrating patterns of a dithering mask used as an embodiment of the present disclosure.

As shown in the drawings, the dithering mask has a certain repeating pattern and includes white pixels and black pixels.

Figure 3:
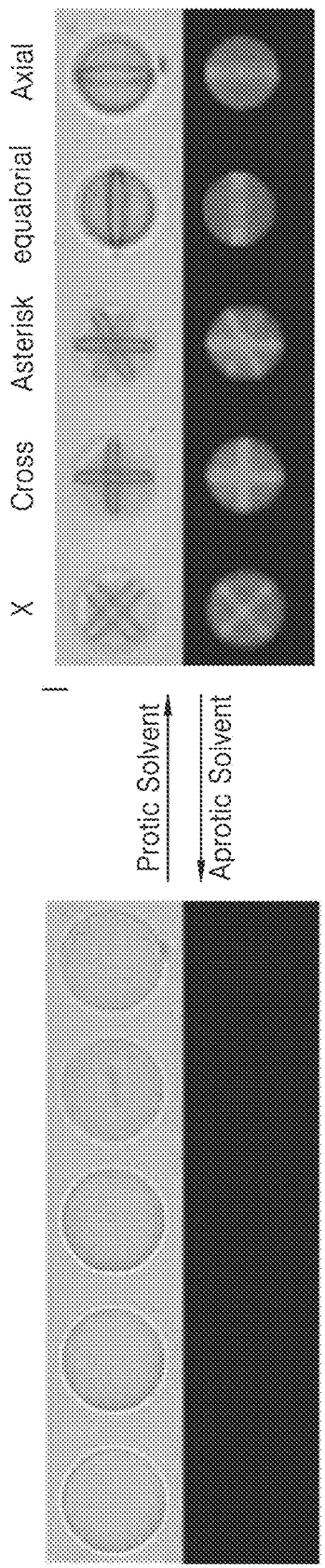
FIG. 3 shows that when a first solvent (ACN) and a second solvent (methanol) are repeatedly, alternately used according to an embodiment of the present disclosure, organogels manufactured using a dithering mask express holographic patterns having various shapes, through contraction.

FIG. 3 shows holographic patterns having various shapes, expressed by organogels through contraction, wherein the organogels are manufactured using a dithering mask (rhombus, square, hexagonal, a horizontal line, and a vertical line) when a first solvent (ACN) and a second solvent (methanol) are repeatedly changed, according to an embodiment of the present disclosure.

Figure 4:
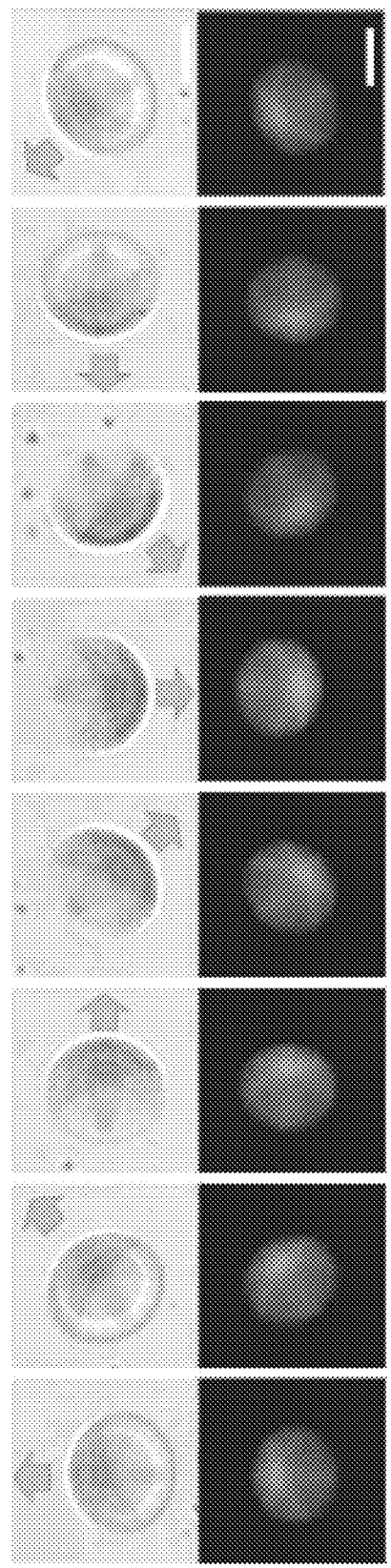
FIG. 4 illustrates various three-dimensional patterns transferred when inclining a holographic pattern-expressing organogel in upward, downward, left, right, and diagonal directions, according to an embodiment of the present disclosure.

FIG. 4 illustrates various three-dimensional patterns transferred when inclining a holographic pattern-expressing organogel in upward, downward, left, right, and diagonal directions, according to an embodiment of the present disclosure.

As shown in the drawings, the holographic pattern of the organogel manufactured using the dithering mask has full parallax characteristics.

Figure 5:
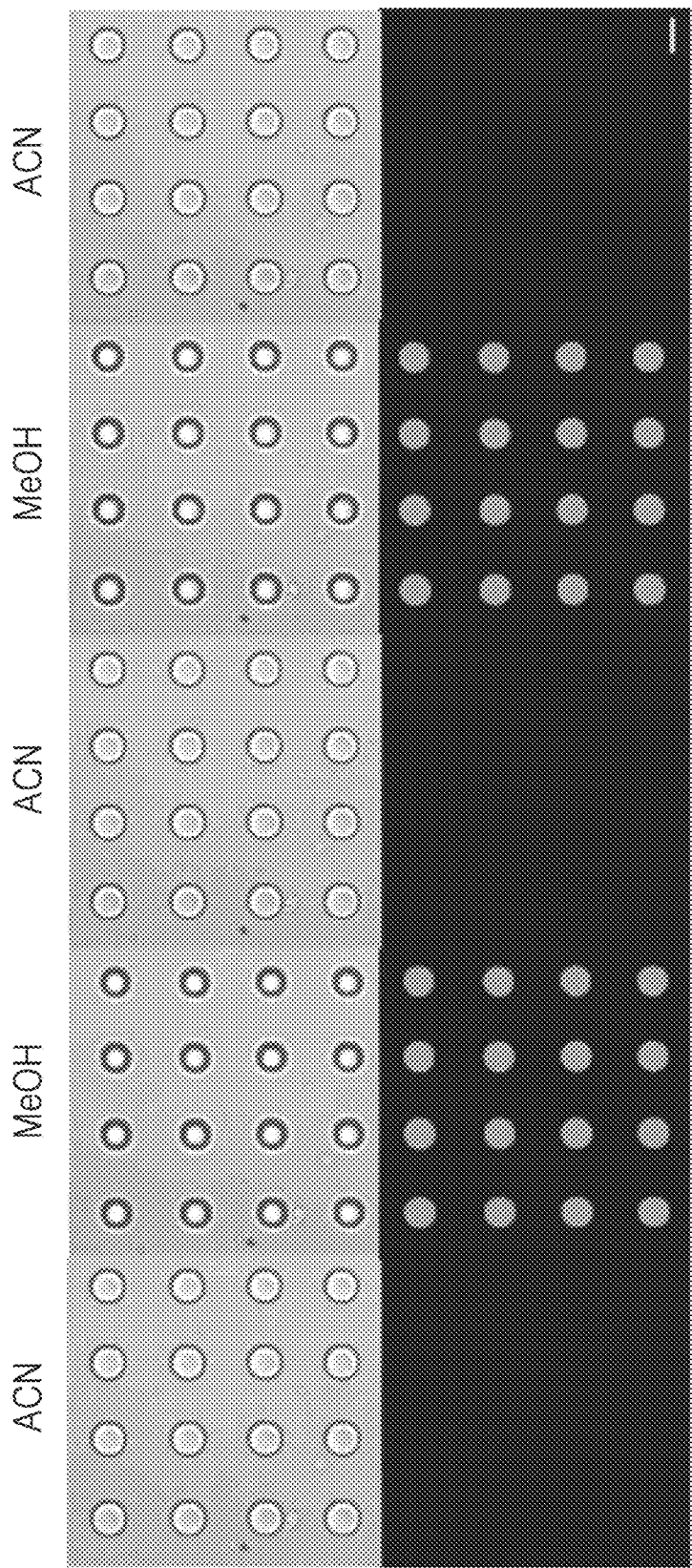
FIG. 5 illustrates a holographic pattern that is realized to reversibly change when the first solvent (ACN) and the second solvent (methanol) are repeatedly alternately used, according to an embodiment of the present disclosure.

FIG. 5 illustrates a holographic pattern that is realized to reversibly change when the first solvent (ACN) and the second solvent (methanol) are repeatedly changed, according to an embodiment of the present disclosure.

Figure 6:
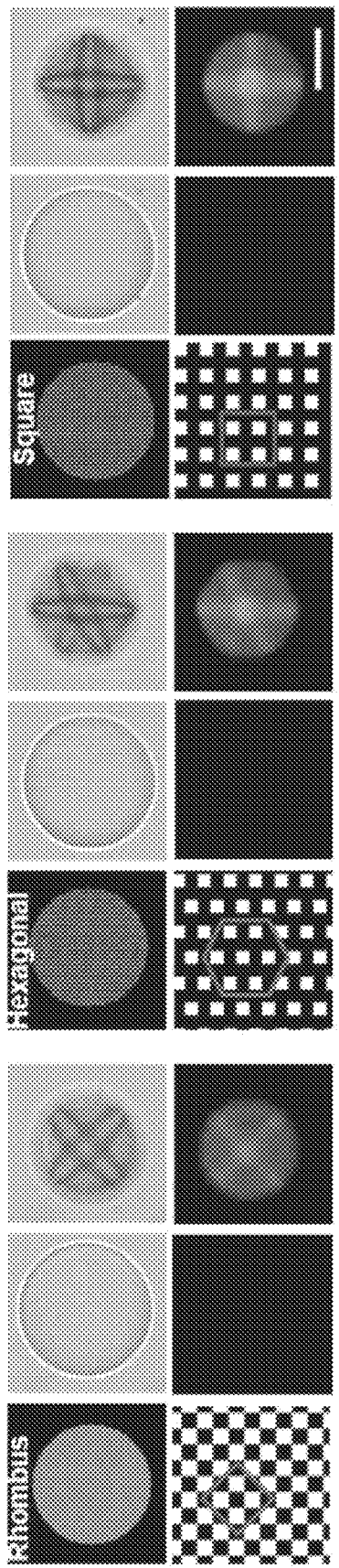
FIG. 6 is a photographic image showing that transformation of structures each having a halftone pattern (rhombus, hexagonal, and square) is controlled according to an external geometric structure in a dithering mask according to an embodiment of the present disclosure, and micro-moire patterns that are generated by contraction of the structures are changed according to the controlled transformation of the structures.

FIG. 6 is a photographic image showing that transformation of structures each having a halftone pattern (rhombus, hexagonal, square) is controlled according to an external geometric structure in a dithering mask according to an embodiment of the present disclosure, and micro-moire patterns that are generated by contraction of the structures are changed according to the controlled transformation of the structures.

Figure 7:
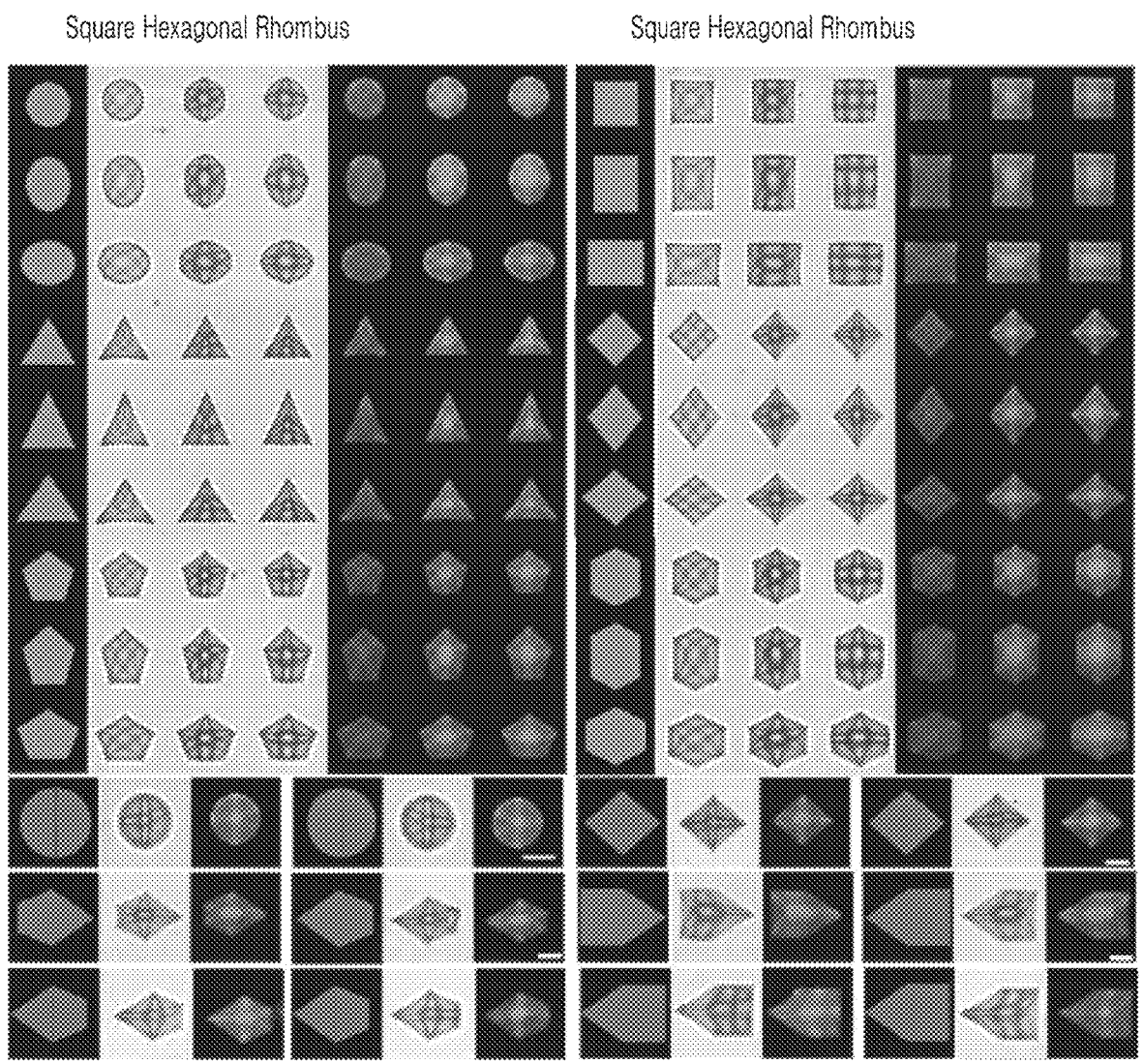
FIG. 7 illustrates various holographic pattern characteristics appearing according to an external geometric structure and internal geometric structure of a dithering mask.

FIG. 7 illustrates various holographic pattern characteristics appearing according to an external geometric structure and internal geometric structure of a dithering mask.

Illustrated are an example of introducing various external geometric structures and holographic patterns implemented according to the same and an example of manufacturing a dithering mask by using two types of halftone patterns and programming a transformation such that a new micro-pattern in which two types of patterns are combined is formed by transferring the different types of halftone patterns to the left and right of the structure.

According to the above embodiment, it was confirmed that various dithering masks can be manufactured by combining a length, a number, and an angle of external sides, and internal halftone patterns. This suggests the possibility of designing numerous transformations in a structure. Micro-patterns implemented through various transformations are extendable to various shapes, and has an encoding capability in a new way. A dithering mask-based pattern organogel developed by the inventors is determined to be applicable to various multi-level security systems.

Figure 8:
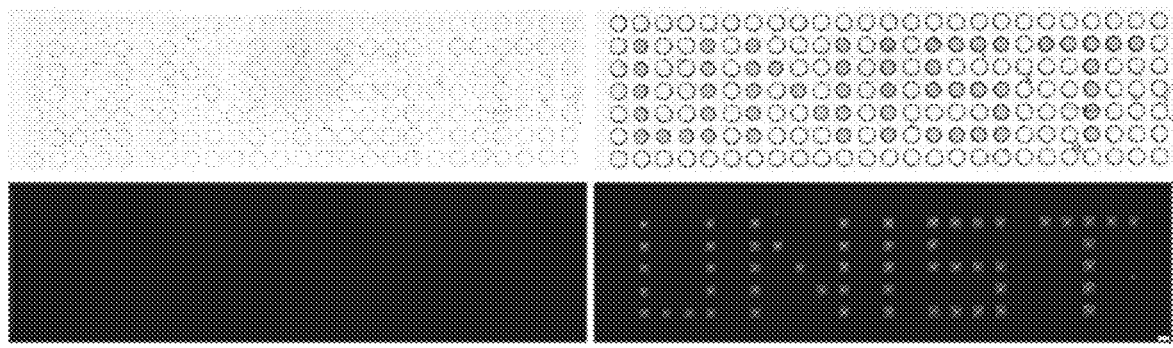
FIG. 8 shows a bright field microscopic image(above) and a fluorescent microscopic image(below) of a micro-architecture system, the images being captured after exposing to an aprotic first solvent (left) and a protic second solvent (right).

FIG. 8 shows a bright field microscopic image(above) and a fluorescent microscopic image(below) of a micro-architecture system, the images being captured after exposing to an aprotic first solvent (left) and a protic second solvent (right).

A scale bar of FIG. 8 is 50 μm, and an expression of characters of "UNIST" which was hidden information according to a solvent exchange was found. This confirmed the industrial applicability of the organogel structure according to the present disclosure to the encoding industry and the forgery prevention industry.

Figure 9A:
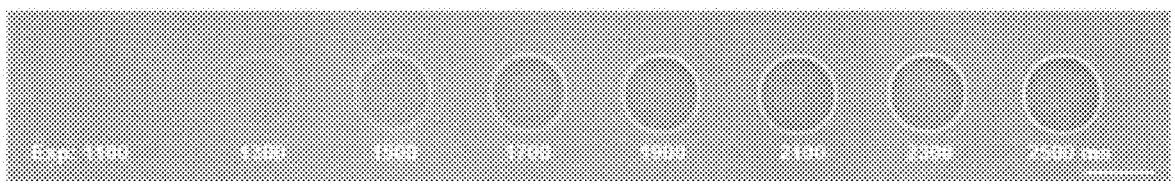
FIG. 9 is a microscopic image showing holographic pattern characteristics that change according to ultraviolet ray exposure time and temperature according to an embodiment of the present disclosure, wherein a bright field microscopy image (FIG. 9A) of 2,4-hexadiyn-1,6-diacrylate (DA-HD) according to an ultraviolet ray exposure time and a fluorescence microscopy image (FIGS. 9B and 9C) of 2,4-hexadiyn-1,6-diacrylate (DA-HD) according to an ultraviolet ray exposure temperature are shown.
Figure 9B:
Figure 9C:
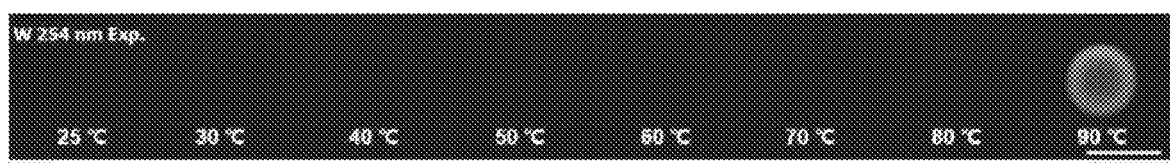

FIG. 9 is a microscopic image showing holographic pattern characteristics that change according to changes in ultraviolet ray exposure time and temperature, according to an embodiment of the present disclosure: a Bright field microscopy image (FIG. 9A) of 2,4-hexadiyn-1,6-diacrylate (DA-HD) according to an ultraviolet ray exposure time and a Fluorescence microscopy image (FIGS. 9B and 9C) of 2,4-hexadiyn-1,6-diacrylate (DA-HD) according to an ultraviolet ray exposure temperature.

The above images show a level of photo polymerization occurring according to the ultraviolet ray exposure time and temperature and a state of holographic pattern realized.

Figure 10:
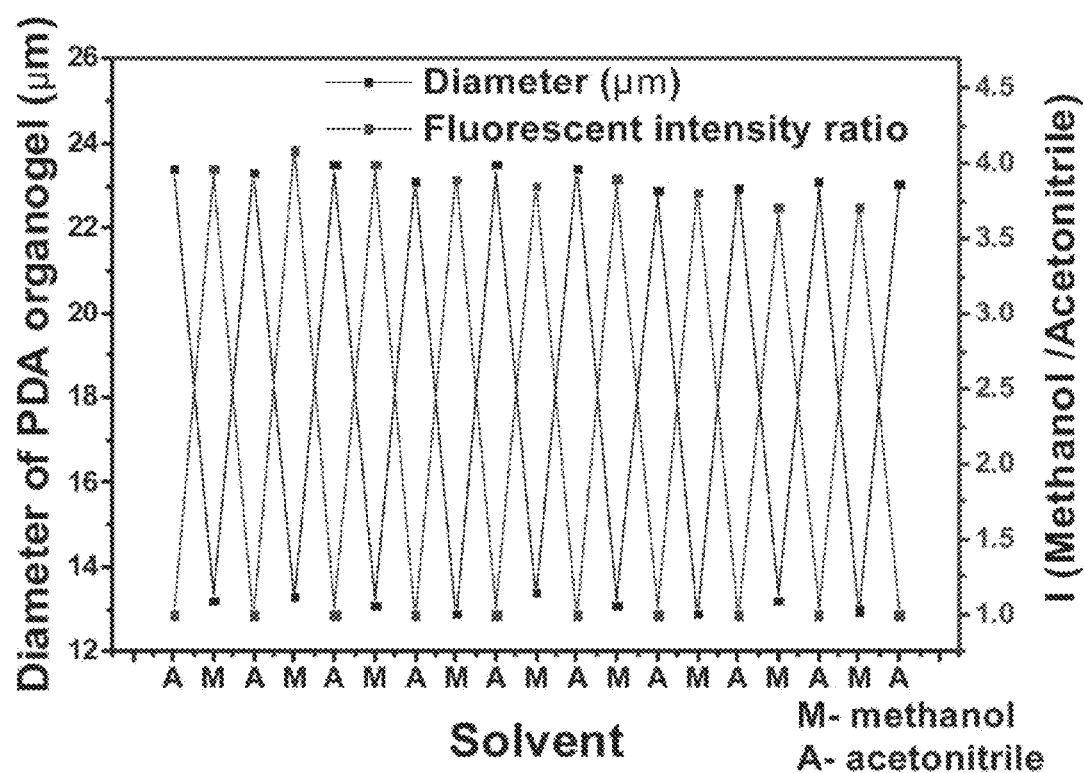
FIG. 10 is a graph showing comparison of fluorescent intensities of micro-structures generated in an organogel when a first solvent and a second solvent are alternately used, according to an embodiment of the present disclosure, according to a volume change in the micro-structures, fluorescence transfer of the micro-structures, and types of external solvents.

FIG. 10 is a graph showing comparison of fluorescent intensities of micro-structures generated in an organogel when a first solvent and a second solvent are substituted, according to an embodiment of the present disclosure, according to a volume change in the micro-structures, fluorescence transfer of the micro-structures, and types of external solvents. A fluorescent intensity ratio was inversely proportional to a diameter of an organic nanogel microstructure.

Figure 11:
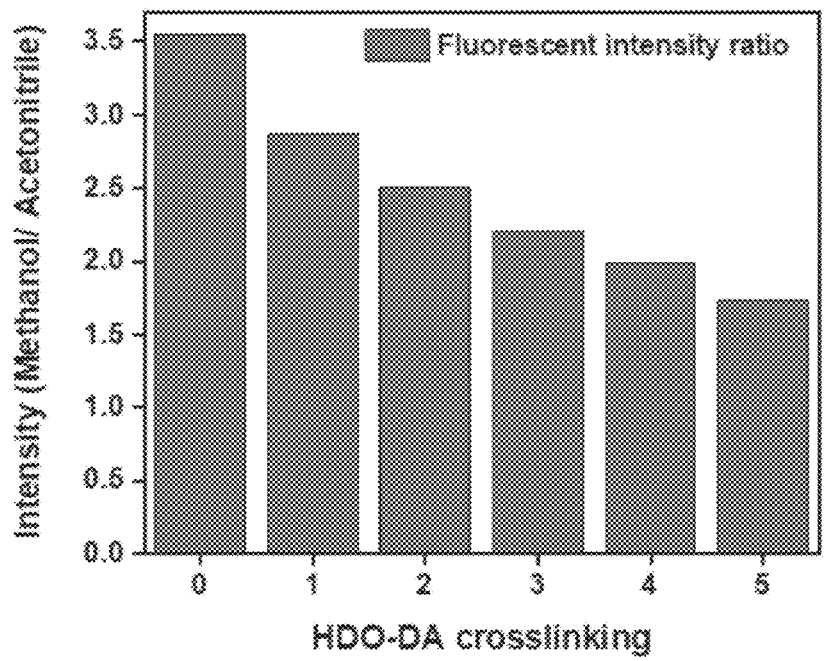
FIG. 11 is a graph showing a fluorescent intensity ratio of a conjugated organic material micro-structure realized during a solvent substitution of a first solvent and a second solvent (methanol/acetonitrile) according to a cross-link density of 1,6-hexanediol diacrylate (HDDA), according to an embodiment of the present disclosure.

FIG. 11 is a graph showing a fluorescent intensity ratio of a conjugated organic material micro-structure realized during a solvent substitution of a first solvent and a second solvent (methanol/acetonitrile) according to a cross-link density of 1,6-hexanediol diacrylate (HDDA), according to an embodiment of the present disclosure.

Figure 12:
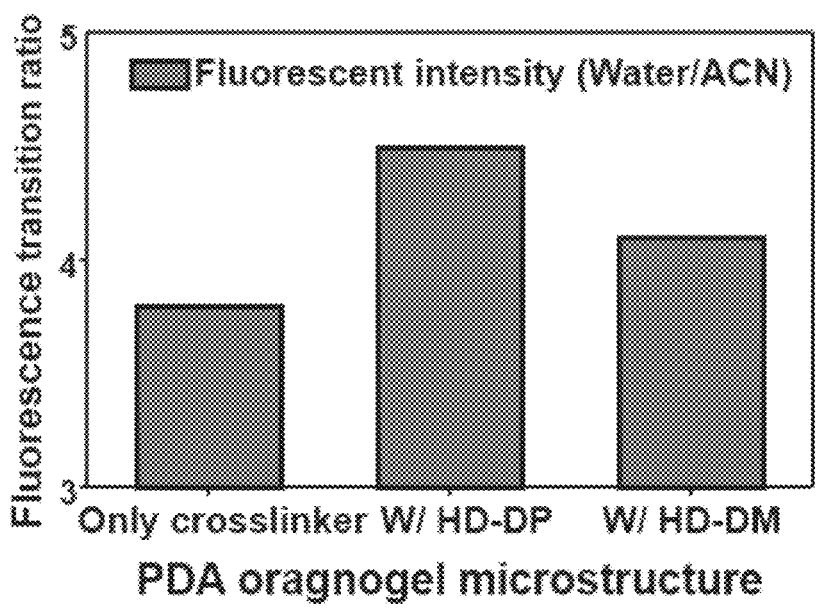
FIG. 12 shows a fluorescent intensity ratio implemented when a conjugation additive is not added and when added, according to an embodiment of the present disclosure.

FIG. 12 shows a fluorescent intensity ratio implemented when a conjugation additive is not added and when added, according to an embodiment of the present disclosure. It is shown that addition of a conjugation additive allows even better holographic pattern expression characteristics.

Figure 13A:
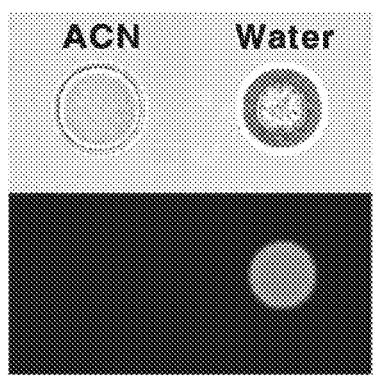
FIG. 13 shows microscopic images of a fluorescence intensity ratio implemented when a conjugation additive is not added and when added, according to an embodiment of the present disclosure (bright field microscopy image (above) and fluorescence microscopy image (below)).
Figure 13B:
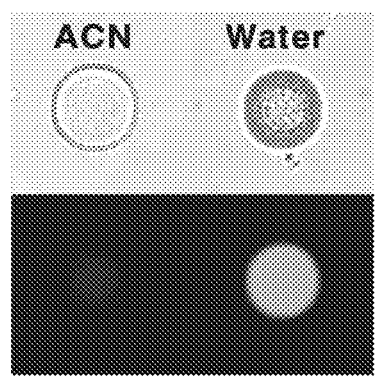
Figure 13C:
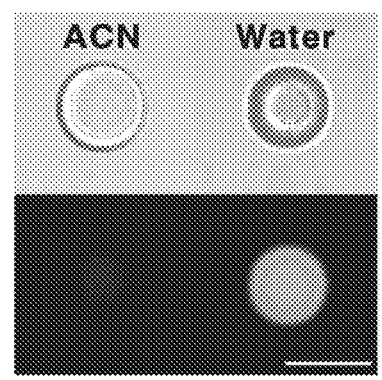

FIG. 13 shows microscopic images of a fluorescence intensity ratio implemented when a conjugation additive is not added and when added, according to an embodiment of the present disclosure (bright field microscopy image (above) and fluorescence microscopy image (below)).

Figure 14:
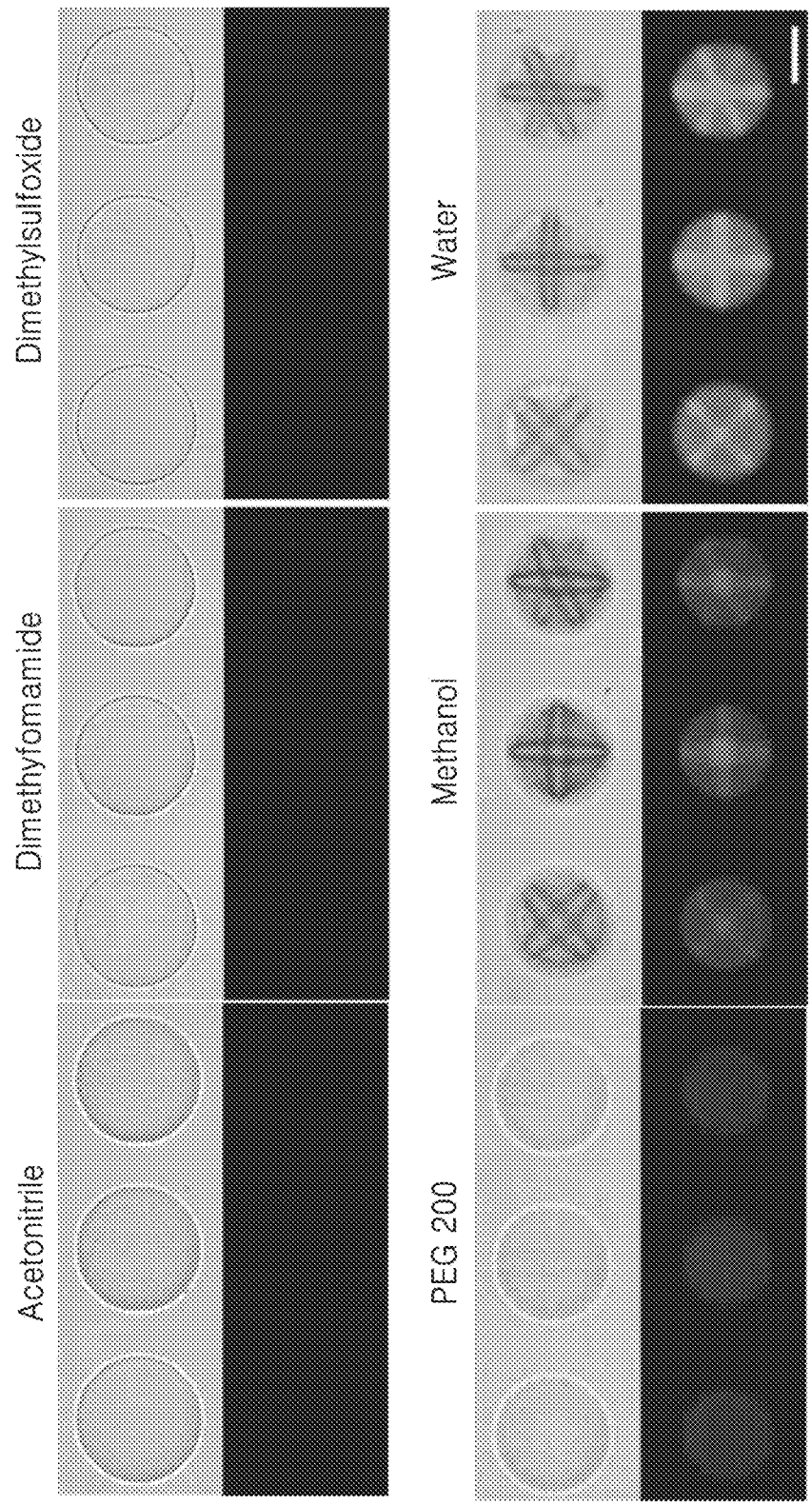
FIG. 14 is a microscopic image showing various dynamic optical and fluorescent micro-patterns having different widths of micro-structures of a PDA organogel when a solvent exchange is performed according to a hydrogen bonding ability (α) of a first solvent and a second solvent, according to an embodiment of the present disclosure.

FIG. 14 is a microscopic image showing various dynamic optical and fluorescent micro-patterns having different widths of micro-structures of a PDA organogel when a solvent exchange is performed according to a hydrogen bonding ability ($\alpha$) of a first solvent and a second solvent, according to an embodiment of the present disclosure. Various holographic pattern shapes realized when the organogel structure is exposed to various solvents having different hydrogen bonding abilities ($\alpha$) are shown.

While the disclosure has been particularly shown and described with reference to examples thereof, it will be understood by those of ordinary skill in the art that various changes in form and details may be made therein. For example, an appropriate result may be attained even when the above-described techniques are performed in a different order from the above-described method, and/or components are coupled or combined in a different form from the above-described methods or substituted for or replaced by other components or equivalents thereof. Thus, other implementations, other embodiments, and those equivalent to the claims also fall within the scope of the claims to be described later.

The invention claimed is:

1. A method of manufacturing an organogel expressing a holographic pattern by using a dithering mask, the method comprising:
    preparing a dithering mask including white pixels and black pixels arranged in periodic patterns;
    photocuring a polymer by passing an ultraviolet ray through the dithering mask;
    passing a first solvent through the cured polymer; and
    passing a second solvent through the cured polymer through which the first solvent has been passed.

2. The method of claim 1, wherein, in the photocuring of a polymer by passing an ultraviolet ray through the dithering mask, a digital micromirror device (DMD)-based exposure device is used.

3. The method of claim 1, wherein the polymer comprises one or more selected from polydiacetylene (PDA), polyethylene glycol diacrylate (PEG-DA), 1,6-hexanediol diacrylate (HDDA), and polyurethane acrylate (PUA).

4. The method of claim 1, wherein the polymer further comprises a conjugation additive.

5. The method of claim 1, wherein the first solvent has a lower hydrogen bonding ability than the second solvent, and
    in the passing of the first solvent, the cured polymer expands, and
    in the passing of the second solvent, the cured polymer contracts.

6. The method of claim 1, wherein
    the first solvent comprises one or more selected from acetonitrile (ACN), dimethylformamide, dimethylsulfoxide, and acetone, and
    the second solvent comprises one or more selected from PEG, methanol, ethanol, isopropanol, n-butanol, and water.

7. The method of claim 1, wherein
    the organogel comprises a rod region and a matrix region each formed in periodic patterns, wherein the rod region has a high curing density and the matrix region has a low curing density, and
    the organogel expresses a holographic pattern upon light irradiation as a three-dimensional refractive index distribution of the rod region and the matrix region is varied through asymmetric contraction occurring during a solvent exchange.

8. The method of claim 1, wherein, after the passing of the second solvent through the cured polymer through which the first solvent has been passed,
    the passing of the first solvent, is performed one or more times; or
    the cycle of the passing of the first solvent and then the passing of the second solvent, is performed one or more times.

9. The method of claim 1, wherein
    when the passing of the first solvent is performed, holographic pattern expression of the organogel is turned off, and
    when the passing of the second solvent is performed, holographic pattern expression of the organogel is turned on.

10. The method of claim 1, wherein a pattern of the dithering mask comprises an external geometric pattern and an internal dithering pattern formed in the external geometric pattern.

11. An organogel structure for expressing a holographic pattern by using a dithering mask,
    wherein the organogel structure is manufactured using the method of claim 1,
    wherein the organogel comprises a rod region and a matrix region each formed in periodic patterns, the rod region having a high curing density and the matrix region having a low curing density, and
    the organogel expresses a holographic pattern due to a change in scattering characteristics in a boundary between the rod region and the matrix region as a three-dimensional refractive index distribution of the rod region and the matrix region is varied through asymmetric contraction occurring during a solvent exchange.

* * * * *